(12) United States Patent
Naka et al.

(10) Patent No.: US 10,027,218 B2
(45) Date of Patent: Jul. 17, 2018

(54) POWER SEMICONDUCTOR ELEMENT DRIVING CIRCUIT

(71) Applicant: Mitsubishi Electric Corporation, Chiyoda-ku (JP)

(72) Inventors: Yoshitaka Naka, Chiyoda-ku (JP); Yasushi Nakayama, Chiyoda-ku (JP); Yoshiko Tamada, Chiyoda-ku (JP); Shoichi Orita, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 4 days.

(21) Appl. No.: 15/322,763

(22) PCT Filed: Jan. 21, 2015

(86) PCT No.: PCT/JP2015/051450
§ 371 (c)(1),
(2) Date: Dec. 29, 2016

(87) PCT Pub. No.: WO2016/002237
PCT Pub. Date: Jan. 7, 2016

(65) Prior Publication Data
US 2017/0141673 A1 May 18, 2017

(30) Foreign Application Priority Data
Jun. 30, 2014 (JP) .................. 2014-133696

(51) Int. Cl.
*H03B 1/00* (2006.01)
*H03K 3/00* (2006.01)
(Continued)

(52) U.S. Cl.
CPC ...... *H02M 1/08* (2013.01); *H02M 2001/0054* (2013.01)

(58) Field of Classification Search
CPC .................. H02M 1/08; H02M 2001/0054
(Continued)

(56) References Cited

U.S. PATENT DOCUMENTS

2013/0088266 A1  4/2013  Liang

FOREIGN PATENT DOCUMENTS

| JP | 2002-94363 A | 3/2002 |
|---|---|---|
| JP | 2003-125574 A | 4/2003 |

(Continued)

OTHER PUBLICATIONS

International Search Report dated Apr. 14, 2015 in PCT/JP2015/051450 filed Jan. 21, 2015.
(Continued)

*Primary Examiner* — Lincoln Donovan
*Assistant Examiner* — Metasebia Retebo
(74) *Attorney, Agent, or Firm* — Oblon, McClelland, Maier & Neustadt, L.L.P.

(57) ABSTRACT

A power semiconductor device driving circuit has a capacitor whose one end is connected with a first or a second main electrode of a power semiconductor device, a first switch for charging the capacitor and a control electrode of the power semiconductor device with electric charges, and a second switch for discharging electric charges; in the case where when the first switch turns on, the control electrode and the capacitor are charged with electric charges through different resistors, electric charges are discharged from the control electrode and the capacitor through one and the same resistor when the second switch turns on; in the case where when the first switch turns on, the control electrode and the capacitor are charged with electric charges through one and the same resistor, electric charges are discharged from the control electrode and the capacitor through different resistors when the second switch turns on.

7 Claims, 10 Drawing Sheets

(51) Int. Cl.
*H02M 1/08* (2006.01)
*H02M 1/00* (2006.01)

(58) Field of Classification Search
USPC .......................................... 327/109
See application file for complete search history.

(56) References Cited

FOREIGN PATENT DOCUMENTS

| | | | |
|---|---|---|---|
| JP | 2012-147591 A | 8/2012 | |
| JP | 2013-81137 A | 5/2013 | |

OTHER PUBLICATIONS

Office Action dated Jan. 9, 2018 in corresponding Japanese Patent Application No. 2016-531125 (with English Translation), 8 pages.

POWER SEMICONDUCTOR ELEMENT DRIVING CIRCUIT

TECHNICAL FIELD

The present invention relates to a driving circuit for reducing switching loss in a power semiconductor device, especially in a self-arc-extinguishing power semiconductor device.

BACKGROUND ART

In a power semiconductor device utilized in an inverter or a converter for an elevator, an electric railway, or the like, switching loss has a large influence on an increase in consumption energy and in the size of a heat radiation fin. That is why reduction of switching loss in a power semiconductor device is required.

Switching loss in a power semiconductor device is expressed by the product of the current and the voltage across the drain and the source thereof (in the case of a Metal-Oxide Semiconductor Field-Effect Transistor (MOSFET); however, in the case of an Insulated-Gate Bipolar Transistor (IGBT), switching loss in a power semiconductor device is expressed by the current and the voltage across the collector and the emitter thereof; hereinafter, unless noted in particular, description will be made by taking a MOSFET as an example) at a time when the power semiconductor device turns on or turns off. It is preferable that in order to reduce switching loss, the power semiconductor device is switched at high speed so that the product of the current and the voltage across the drain and the source thereof becomes small; however, in a turn-off mode, a large change in the current (hereinafter, referred to as "dI/dt") across the drain and the source of the power semiconductor device causes an parasitic inductance in the circuit to produce a large surge voltage, thereby breaking the power semiconductor device. A large change in the voltage (hereinafter, referred to as "dV/dt") across the drain and the source and dI/dt, produced by switching of the power semiconductor device, cause large radiation noise; therefore dI/dt and dv/dt are limited and high-speed switching is not readily be performed.

The switching speed undergoes a large influence of the input capacitance of a power semiconductor device. The input capacitance is given as the summation of the gate-to-source parasitic capacitance and the gate-to-drain parasitic capacitance of a self-arc-extinguishing power semiconductor device. By charging and discharging the input capacitance, the switching of the self-arc-extinguishing power semiconductor device is performed. The simplest method for adjusting the switching speed is to adjust the gate resistance; however, this method causes both dV/dt and dI/dt of the power semiconductor device to change. Accordingly, due to the restriction of noise and a surge voltage, the gate resistance and the switching speed should be made large and low, respectively; thus, the switching loss increases.

In a conventional driving circuit, by adding a capacitor between the gate and the source of a power semiconductor device and adjusting the gate resistance so that the switching speed becomes equal to that at a time when no capacitor is inserted, dI/dt and dV/dt are controlled individually so that a low-loss turn-on mode is realized (e.g., refer to Patent Document 1).

PRIOR ART REFERENCE

Patent Document

[Patent Document 1] Japanese Patent Application Laid-Open No. 2003-125574

DISCLOSURE OF THE INVENTION

Problems to be Solved by the Invention

In the driving circuit for a self-arc-extinguishing power semiconductor device, disclosed in Patent Document 1, dV/dt and dI/dt in the turn-on mode are controlled individually, so that switching loss in the turn-on mode can be reduced. However, dV/dt and dI/dt in the turn-off mode cannot be controlled; therefore, when the switching speed in the turn-on mode is limited due to noise or the like, switching loss in the turn-off mode cannot be reduced. Moreover, in the conventional technology disclosed in Patent Document 1, the turn-on mode and the turn-off mode cannot be controlled separately from each other. As a result, for example, in the case where the turn-off speed is limited due to noise, a surge voltage, or the like, switching loss in the turn-on mode cannot be reduced. In order to solve the foregoing problems, it is required that dV/dt and dI/dt in each of the turn-on mode and the turn-off mode are controlled individually. When dV/dt and dI/dt in each of the turn-on mode and the turn-off mode can be controlled individually, the switching loss can further be reduced.

In the case where as a semiconductor material for a power semiconductor device, silicon carbide (SiC) is utilized, a MOSFET can be utilized in a high voltage region, in comparison with silicon (Si). In the case of an IGBT in which the turn-on voltage is lowered through a conductivity modulation effect, an electric current continues to flow until carriers accumulated in the drift layer are recombined and disappear in the turn-off mode. For that reason, switching-speed control in the turn-off mode is limited. However, in the case of a MOSFET, the foregoing phenomenon does not occur; thus, control of the turn-off mode switching speed, which is difficult to perform in a conventional IGBT, is readily performed. Accordingly, a method in which dV/dt and dI/dt are individually controlled not only in the turn-on mode but also in the turn-off mode, where the conventional technology is not capable of controlling dV/dt and dI/dt individually, is effective.

The objective of the present invention is to provide a power semiconductor device driving circuit that can control dV/dt and dI/dt individually in each of the turn-on mode and the turn-off mode, thereby reducing switching loss.

Means for Solving the Problems

The present invention is a driving circuit for a power semiconductor device having a first main electrode, a second main electrode, and a control electrode for controlling an electric current flowing between the first main electrode and the second main electrode; the power semiconductor device driving circuit includes
a capacitor whose one end is connected with the first main electrode or the second main electrode, a first switch that is provided for charging the control electrode and the capacitor with electric charges and whose one end is connected with the positive output terminal of a control power source, and a second switch that is provided for discharging electric charges from the control electrode and the capacitor and whose one end is connected with the negative output terminal of the control power source; a first resistor, a first diode, and a second resistor are connected in series and in that order between the other end of the first switch and the other end of the second switch, and the first diode is connected forward with respect to the control power source; in any one of the cases where the first switch is turned on and then the control electrode is charged with electric charges through the first resistor and the capacitor is charged with electric charges and where the second switch is turned on and then electric charges are discharged from the control electrode through the second resistor and electric charges are discharged from the capacitor, a resistor through which electric charges to or from the control electrode pass is different from a resistor through which electric charges to or from the capacitor pass; when the first switch is turned on and then electric charges to be charged into the control electrode and electric charges to be charged into the capacitor pass through different resistors, each of a resistor through which electric charges from the control electrode pass and a resistor through which electric charges from the capacitor pass is the second resistor, when the second switch is turned on and then electric charges are discharged from the control electrode and the capacitor; when the second switch is turned on and then electric charges to be discharged from the control electrode and electric charges to be discharged from the capacitor pass through the different resistors, each of a resistor through which electric charges to the control electrode pass and a resistor through which electric charges to the capacitor pass is the first resistor, when the first switch is turned on and then the control electrode and the capacitor are charged with electric charges.

Advantage of the Invention

The present invention makes it possible to individually control the charging and discharging times in any one of the turn-on mode and the turn-off mode and the charging and discharging times for anyone of the parasitic capacitance between the control electrode and the first main electrode and the parasitic capacitance between the control electrode and the second main electrode; thus, dv/dt and dI/dt can individually be controlled in each of the turn-on mode and the turn-off mode. Accordingly, even in the situation where the turn-on mode dV/dt or dI/dt is limited due to noise, the turn-off-mode dV/dt or dI/dt can be increased and hence the turn-off-mode switching speed can be raised. Furthermore, even in the situation where the turn-off-mode dV/dt or dI/dt is limited due to noise, a surge, or the like, the turn-on-mode dV/dt or dI/dt can be increased and hence the turn-on-mode switching speed can be raised. Therefore, a power semiconductor device driving circuit that can reduce switching loss in comparison with conventional ones can be provided.

BEST MODE FOR CARRYING OUT THE INVENTION

Embodiment 1

Figure 1:
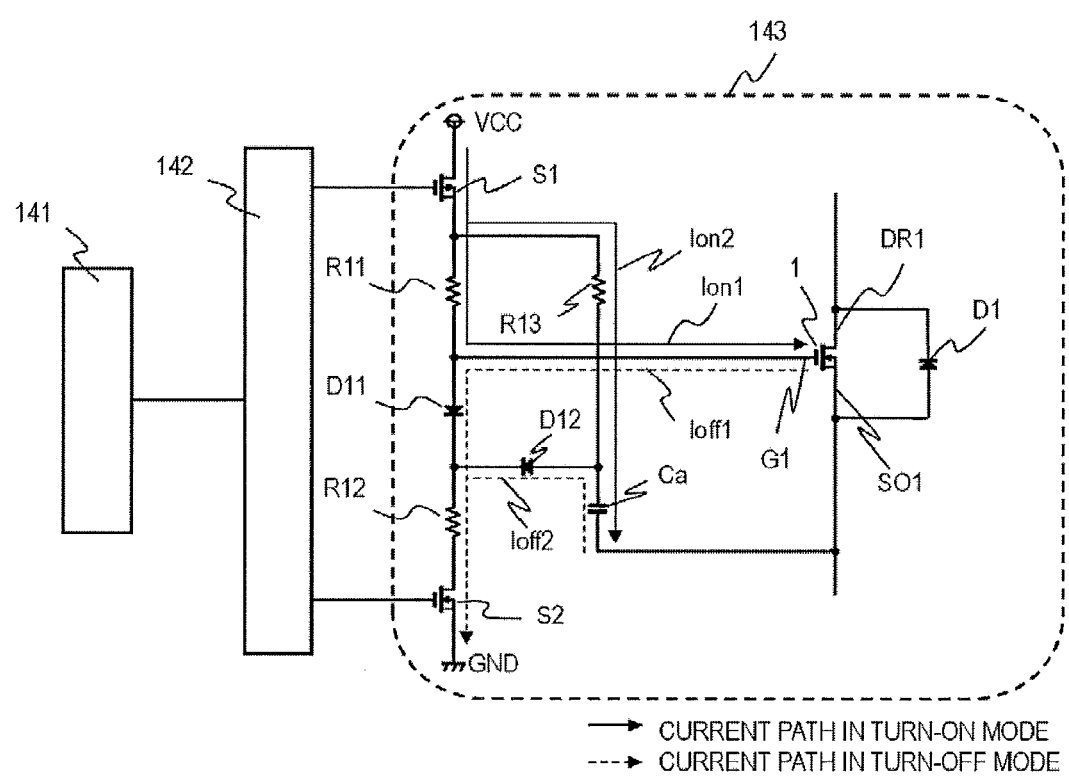
FIG. 1 is a circuit diagram representing a power semiconductor device driving circuit according to Embodiment 1 of the present invention.

FIG. 1 is a circuit diagram representing a power semiconductor device driving circuit according to Embodiment 1 of the present invention. In FIG. 1, a signal from a control signal output circuit 141 is transmitted byway of an insulating circuit 142. The transmitted signal turns on one of a first switch S1 and a second switch S2; the electric potential at a gate G1 of a self-arc-extinguishing power semiconductor device 1 is changed; then, the power semiconductor device 1 is driven. With regard to a power semiconductor device driving circuit according to the present invention, it is only necessary that the power semiconductor device is a gate-driven semiconductor device; for example, the power semiconductor device driving circuit can be applied to each of a Metal-Oxide Semiconductor Field-Effect Transistor (MOSFET) and an Insulated-Gate Bipolar Transistor (IGBT). The respective electrodes of a MOSFET are referred to as a drain, a source, and a gate; an electric current flowing between the drain and the source is controlled by an electric potential at the gate. The respective electrodes of an IGBT are referred to as a collector, an emitter, and a gate; an electric current flowing between the collector and the emitter is controlled by an electric potential at the gate. In the present application, the drain and the source of a MOSFET or the collector and the emitter of an IGBT are referred to also as a first main electrode and a second main electrode, respectively; the gate is referred to also as a control electrode. That is to say, the present application relates to a driving circuit that drives a power semiconductor device having a control electrode for controlling an electric current that flows between a first main electrode and a second main electrode. Hereinafter, as an example, a case where the power semiconductor device 1, the first switch S1, and the second switch S2 are all MOSFETs will be explained.

The first switch S1, a first resistor R11, a first diode D11, a second resistor R12, and a second switch S2 are connected in series and in that order between the output terminals VCC and GND of a control power source. The first diode D11 is connected in the forward direction with respect to the control power source. The gate G1, which is the control electrode of the power semiconductor device 1, is connected with the connection point between the first resistor R11 and the anode of the first diode D11. One end of a capacitor Ca is connected with a source SO1, which is the second main electrode of the power semiconductor device 1; the other end of the capacitor Ca is connected with one end of a third resistor R13 whose other end is connected with the connection point between the first switch S1 and the first resistor R11. The anode of a second diode D12 is connected with the connection point between the capacitor Ca and the third resistor R13; the cathode of the second diode D12 is connected with the connection point between the cathode of the first diode D11 and the second resistor R12. A diode D1 is connected in parallel with the power semiconductor device 1. That is to say, the cathode and the anode of the diode D1 are connected with a drain DR1 and the source SO1, respectively, of the power semiconductor device 1. The gate of the first switch S1 and the gate of the second switch S2 are connected with the insulating circuit 142; the insulating circuit 142 is connected with the control signal output circuit 141.

The operation, at a time when the power semiconductor device 1 turns on, of the power semiconductor device driving circuit configured in such a manner as described above will be explained. In a driving circuit 143, when the first switch S1 turns on, i.e., in the turn-on mode thereof, respective electric currents flow in a path Ion1 for charging the gate G1 with electric charges by way of the first switch S1 and the first resistor R11 and in a path Ion2 for charging the capacitor Ca with electric charges by way of the first switch S1 and the third resistor R13. In this situation, the parasitic capacitance between the gate G1 and the source SO1 of the self-arc-extinguishing power semiconductor device 1 and the capacitor Ca are charged through respective different resistors; therefore, the capacitor Ca hardly affects charging the parasitic capacitance between the gate G1 and the source SO1 of the power semiconductor device 1. Thus, the capacitor Ca hardly affects the turn-on-mode dV/dt, dI/dt, and switching loss of the power semiconductor device 1.

Next, the operation at a time when the power semiconductor device 1 turns off will be explained. In the driving circuit 143, when the second switch S2 turns on, i.e., in the turn-off mode thereof, electric currents flow in a path Ioff1 for discharging electric charges from the gate G1 through the first diode D11, the second resistor R12, and the second switch S2, which are connected in series, and in a path Ioff2 for discharging electric charges from the capacitor Ca through the second diode D12, the second resistor R12, and the second switch S2, which are connected in series; as a result, electric charges are discharged from the capacitor Ca and the parasitic capacitance between the gate G1 and the source SO1 of the power semiconductor device 1. In this situation, in order to lower the voltage at the gate G1, it is required to discharge the capacitance obtained by adding the capacitance of the capacitor Ca and the parasitic capacitance between the gate G1 and the source SO1 of the power semiconductor device 1, because the capacitor Ca is connected in parallel with the parasitic capacitance between the gate G1 and the source SO1 of the power semiconductor device 1. When the capacitor Ca is just simply added, the amount of electric charge to be discharged increases; thus, the switching speed is lowered. In Embodiment 1 of the present invention, the switching speed in the turn-off mode can be adjusted by adjusting the capacitance of the capacitor Ca and the resistance value of the second resistor R12.

In this description, as an example, there will be explained the case where the capacitance of the capacitor Ca and the resistance value of the second resistor R12 are adjusted so that the turn-off-mode dI/dt of the power semiconductor device 1 becomes equal to the turn-off-mode dI/dt of the power semiconductor device 1 in a driving circuit 643, as a comparative example represented in FIG. 2, in which no capacitor Ca is added. That is to say, the adjustment is performed in such a way that the time constant determined by the resistor R20 in FIG. 2 and the turn-off-mode capacitance of the gate G1 of the power semiconductor device 1 becomes equal to the time constant determined by the second resistor R12 in FIG. 1, the turn-off-mode capacitance of the gate G1 of the power semiconductor device 1, and the capacitance of the capacitor Ca. By performing the adjustment in this manner, the resistance value of the second resistor R12 in FIG. 1 according to Embodiment 1 becomes smaller than that of the resistor R20 in the comparative example represented in FIG. 2.

Figure 2:
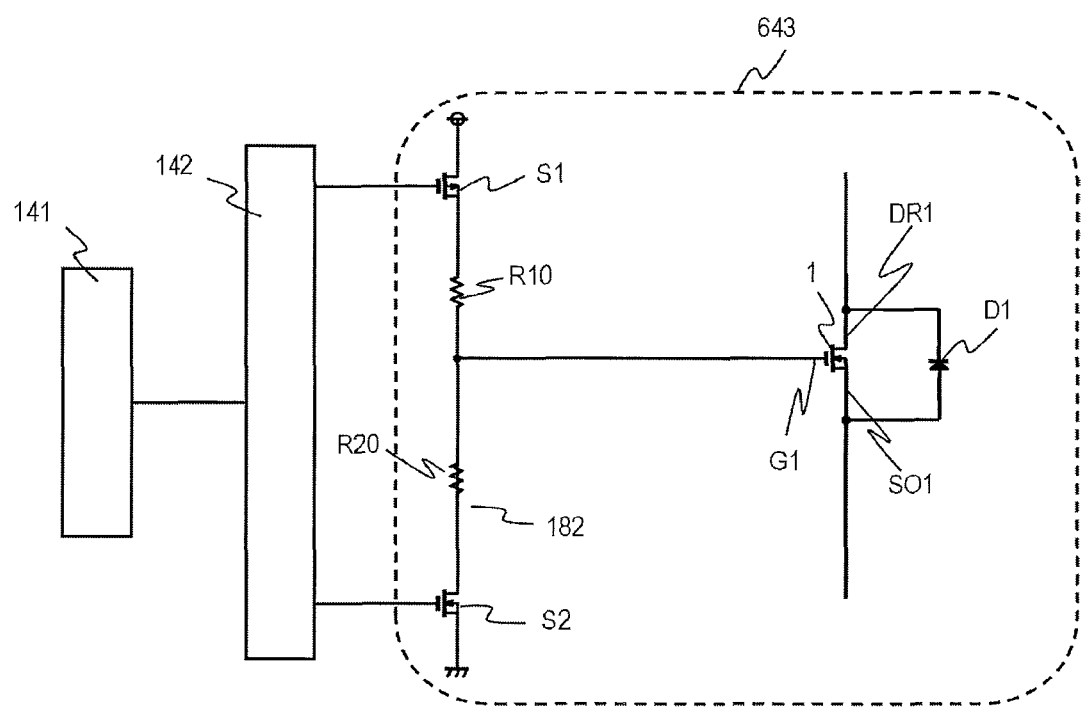
FIG. 2 is a circuit diagram representing a comparative example of power semiconductor device driving circuit.
Figure 3:
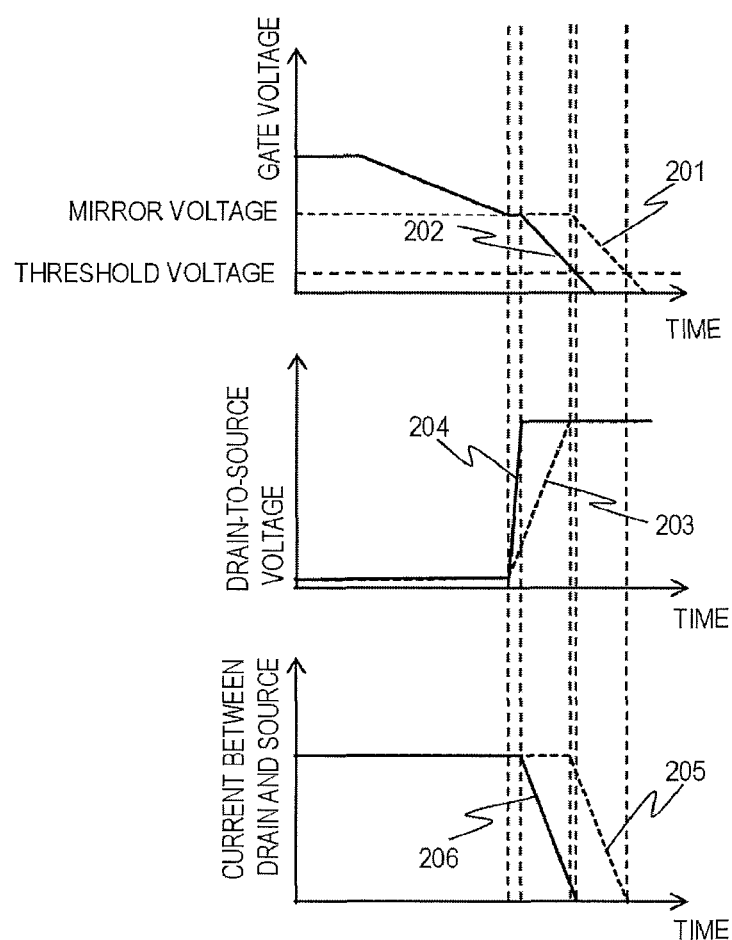
FIG. 3 is a set of schematic waveform charts for explaining the turn-off-mode operation of the power semiconductor device driving circuit according to Embodiment 1 of the present invention.

FIG. 3 is a set of schematic waveform charts for explaining the turn-off-mode operation of the power semiconductor device driving circuit, represented in FIG. 1, according to Embodiment 1 of the present invention. Broken lines 201, 203, and 205 represent the voltage at the gate G1 of the power semiconductor device 1 in the driving circuit 643 in FIG. 2, which is a comparative example in which no capacitor is added, the voltage between the drain DR1 and the source SO1, and the electric current that flows between the drain DR1 and the source SO1, respectively. In contrast, solid lines 202, 204, and 206 represent the voltage at the gate G1 of the power semiconductor device 1, the voltage between the drain DR1 and the source SO1, and the electric current that flows between the drain DR1 and the source SO1, respectively, at a time when in the circuit in FIG. 1, in which the capacitor Ca is added, the second resistor R12 is adjusted so that the dI/dt of the electric current that flows between the drain DR1 and the source SO1 becomes equal to that in the case of the circuit in FIG. 2.

A turn-off signal is inputted; the second switch S2 is turned on; then, the gate voltage starts to decrease, as represented by the line 201 or 202. Because although the capacitor Ca is added, the capacitance of the capacitor Ca and the resistance value of the second resistor R12 are adjusted so that the discharge time constant becomes equal to that in the case of the driving circuit 643 in FIG. 2, the respective waveforms of the gate voltages 201 and 202 are the same as each other. When the gate voltage 201 or 202 further decreases and then reaches the mirror voltage, the drain-to-source voltage 203 or 204, as the case may be, starts to increase. In this situation, the parasitic capacitance between the gate G1 and the drain DR1 of the power semiconductor device 1 largely changes as the voltage 203 or 204 between the drain DR1 and the source SO1 changes. In other words, the mirror period starts in which most of the gate current passes through the path for discharging the parasitic capacitance between the gate G1 and the drain DR1. In the mirror period, the gate voltage hardly changes; thus, the electric charges accumulated in the capacity Ca are hardly discharged in this period. In this situation, the resistance value of the second resistor R12 in Embodiment 1 is smaller than that of the resistor R20 in the comparative example. In contrast, the parasitic capacitance between the gate G1 and the drain DR1 is one and the same whether or not the capacitor Ca is added; therefore, the electric charges in the capacitor Ca are not discharged. Accordingly, the discharge time constant in Embodiment 1 in which the capacitor Ca is added is smaller than that in the comparative example in which no capacitor is added; thus, the discharging time in the mirror period becomes shorter. As described above, Embodiment 1, according to the present invention, in which the capacitor Ca is added makes it possible to make the dV/dt of the drain-to-source voltage 204 larger than the dV/dt of the drain-to-source voltage 203 at a time when no capacity is added.

After the mirror period, each of the gate voltages 201 and 202 starts to decrease and hence the electric current that flows between the drain DR1 and the source SO1 decreases. At this moment, the dI/dt of the electric current that flows between the drain DR1 and the source SO1 depends on the gate voltage. Because the capacitance of the capacitor Ca and the value of the second resistor R12 are adjusted so that when the parasitic capacitance between the gate G1 and the source SO1 is discharged, the respective time constants in Embodiment 1 where the capacitor Ca is added and in the comparative example where no capacitor is added become equal to each other, the respective waveforms of the gate voltages 201 and 202 become the same as each other after the mirror period. Therefore, the dI/dt of the electric current 206 that flows between the drain DR1 and the source SO1 in Embodiment 1 where the capacitor Ca is added becomes the same as the dI/dt of the electric current 205 that flows between the drain DR1 and the source SO1 in the comparative example where no capacitor is added.

In the above description, there has been explained an example in which the adjustment is performed in such a way that the time constant determined by the resistor R20 in FIG. 2 and the turn-off-mode capacitance of the gate G1 of the power semiconductor device 1 becomes equal to the time constant determined by the second resistor R12 in FIG. 1, the turn-off-mode capacitance of the gate G1 of the power semiconductor device 1, and the capacitance of the capacitor Ca. In this regard, however, it is not necessarily required to perform the adjustment in this manner; the power semiconductor device driving circuit according to Embodiment 1 of the present invention is characterized in that because it is made possible to freely select the capacitance of the capacitor Ca and the resistance value of the second resistor R12, the turn-off-mode switching speed can be raised without changing the turn-on-mode switching speed and hence the switching loss can be reduced. Furthermore, it is made possible to change only dV/dt without changing turn-off-mode dI/dt; therefore, even when turn-off-mode dI/dt is limited in order to suppress a surge voltage, it is made possible that turn-off-mode dV/dt is increased without affecting the turn-on mode and hence switching loss in the power semiconductor device 1 is reduced. The time constant determined by the capacitance of the capacitor Ca and the third resistor R13 is limited by the switching period of the power semiconductor device 1; that is to say, the time constant is limited by the time range, for example, the ON time or OFF time of the power semiconductor device 1 within which discharge can be performed. As far as the time constant determined by the capacitance of the capacitor Ca and the resistor is concerned, the foregoing description can be applied to the following embodiments.

The power semiconductor device in Embodiment 1 is not limited to the conventional one formed of silicon; it may be the one formed of a wide bandgap semiconductor having a bandgap that is larger than that of silicon. The material of a wide bandgap semiconductor is a silicon carbide (SiC), a gallium nitride-based material, a diamond, or the like. In addition to a MOSFET, any other semiconductor device such as an IGBT can be applied to the driving circuit according to Embodiment 1, as long as it is a gate-driven semiconductor device. This condition applies also to the following embodiments.

Embodiment 2

Figure 4:
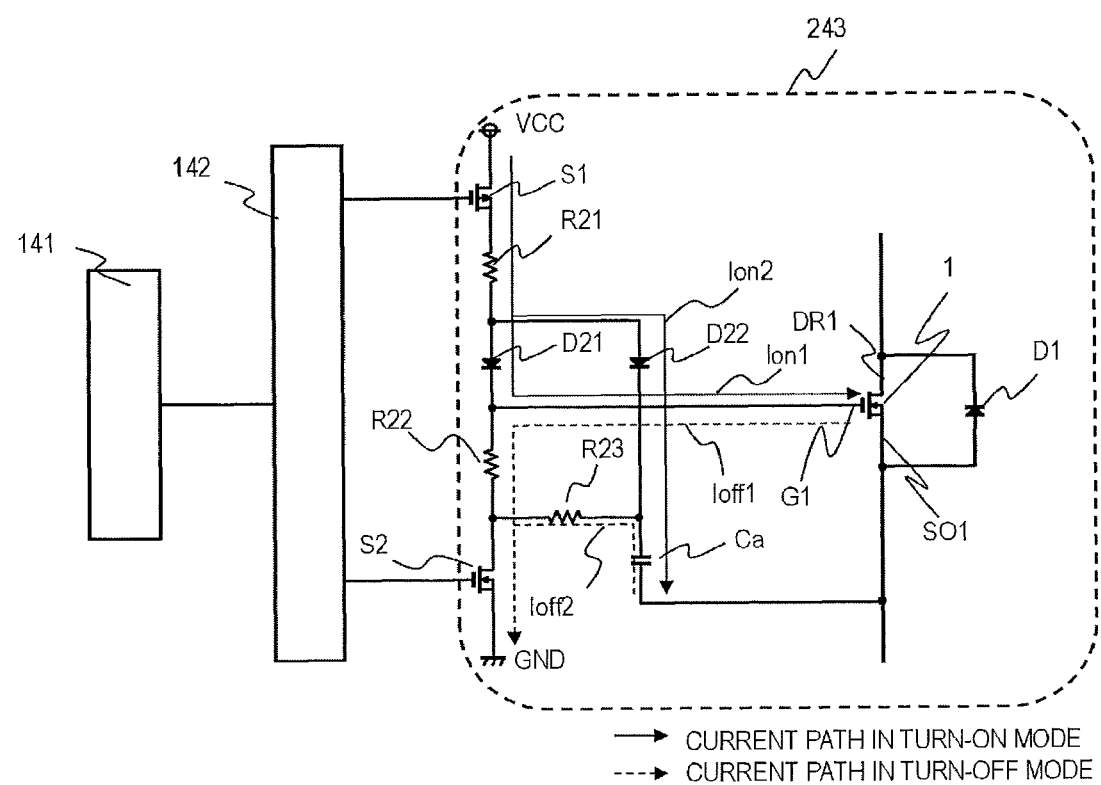
FIG. 4 is a circuit diagram representing a power semiconductor device driving circuit according to Embodiment 2 of the present invention.

FIG. 4 is a circuit diagram representing a power semiconductor device driving circuit 243 according to Embodiment 2 of the present invention. In FIG. 4, a signal from the control signal output circuit 141 is transmitted by way of the insulating circuit 142. The transmitted signal turns on one of the first switch S1 and the second switch S2; the electric potential at the gate G1 of the power semiconductor device 1 is changed; then, the power semiconductor device 1 is driven.

The first switch S1, a first resistor R21, a first diode D21, a second resistor R22, and the second switch S2 are connected in series and in that order between the output terminals VCC and GND of the control power source. The first diode D21 is connected in the forward direction with respect to the control power source. The gate G1, which is the control electrode of the power semiconductor device 1, is connected with the connection point between the second resistor R22 and the cathode of the first diode D21. One end of the capacitor Ca is connected with the source SO1, which is the second main electrode of the power semiconductor device 1; the other end of the capacitor Ca is connected with the cathode of a second diode D22 whose other end is connected with the connection point between the anode of the first diode D21 and the first resistor R21. One end of a third resistor R23 is connected with the connection point between the anode of the second diode D22 and the capacitor Ca; the other end of the third resistor R23 is connected with the connection point between the second resistor R22 and the second switch S2. The diode D1 is connected in parallel with the power semiconductor device 1. That is to say, the cathode and the anode of the diode D1 are connected with the drain DR1 and the source SO1, respectively, of the power semiconductor device 1. The gate of the first switch S1 and the gate of the second switch S2 are connected with the insulating circuit 142; the insulating circuit 142 is connected with the control signal output circuit 141.

The operation, at a time when the power semiconductor device 1 turns off, of the power semiconductor device driving circuit 243 configured in such a manner as described above, according to Embodiment 2 of the present invention, will be explained. In the driving circuit 243, when the second switch S2 turns on, i.e., in the turn-off mode thereof, respective electric currents flow in a path Ioff1 for discharging electric charges from the gate G1 by way of the second resistor R22 and the second switch S2 and in a path Ioff2 for discharging electric charges from the capacitor Ca by way of the third resistor R23 and the second switch S2. In this situation, the parasitic capacitance between the gate G1 and the source SO1 of the self-arc-extinguishing power semiconductor device 1 and the capacitor Ca are discharged through respective different resistors; therefore, the capacitor Ca hardly affects discharging the parasitic capacitance between the gate G1 and the source SO1 of the power semiconductor device 1. Thus, the capacitor Ca hardly affects the turn-off-mode dV/dt, dI/dt, and switching loss in the power semiconductor device 1.

Next, the operation at a time when the power semiconductor device 1 turns on will be explained. In the driving circuit 243, when the first switch S1 turns on, i.e., in the turn-on mode thereof, respective electric currents flow in a path Ion1 for charging the gate G1 with electric charges by way of the first switch S1, the first resistor R21, and the first diode D21 in that order and in a path Ion2 for charging the capacitor Ca with electric charges by way of the first switch S1, the first resistor R21, and the second diode D22 in that order; as a result, the capacitor Ca and the parasitic capacitance between the gate G1 and the source SO1 of the power semiconductor device 1 are charged. In this situation, in order to raise the voltage at the gate G1, it is required to charge the capacitance obtained by adding the capacitance of the capacitor Ca and the capacitance of the parasitic capacitance between the gate G1 and the source SO1 of the power semiconductor device 1, because the capacitor Ca is connected in parallel with the parasitic capacitance between the gate G1 and the source SO1 of the power semiconductor device 1. When the capacitor Ca is just simply added, the amount of electric charge to be charged increases; thus, the switching speed is lowered. In Embodiment 2 of the present invention, the capacitance of the capacitor Ca and the resistance value of the first resistor R21 are adjusted so that the turn-on-mode dI/dt of the power semiconductor device 1 becomes equal to the turn-on-mode dI/dt of the power semiconductor device 1 at a time when the capacitor Ca is not added, i.e., the turn-on-mode dI/dt in the driving circuit 643 represented in FIG. 2, as a comparative example. By performing the adjustment in this manner, the resistance value of the first resistor R21 in FIG. 4 according to Embodiment 2 becomes smaller than that of the resistor R20 in the comparative example in FIG. 2.

Figure 5:
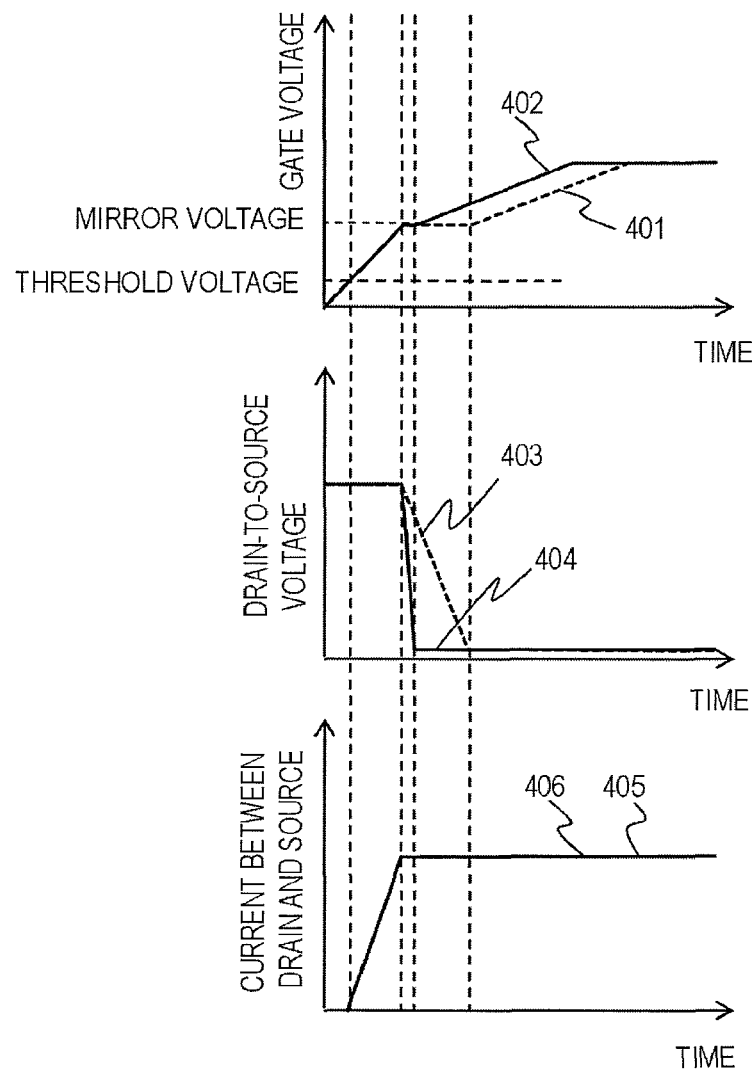
FIG. 5 is a set of schematic waveform charts for explaining the turn-on-mode operation of the power semiconductor device driving circuit according to Embodiment 2 of the present invention.

FIG. 5 is a set of schematic waveform charts for explaining the turn-on-mode operation of the power semiconductor device driving circuit, represented in FIG. 4, according to Embodiment 2 of the present invention. Broken lines 401, 403, and 405 represent the voltage at the gate G1 of the power semiconductor device 1 in the driving circuit 643 in FIG. 2, which is a comparative example where no capacitor is added, the voltage between the drain DR1 and the source SO1, and the electric current that flows between the drain DR1 and the source SO1, respectively. In contrast, solid lines 402, 404, and 406 represent the voltage at the gate G1 of the power semiconductor device 1, the voltage between the drain DR1 and the source SO1, and the electric current that flows between the drain DR1 and the source SO1, respectively, at a time when in the circuit according to Embodiment 2, represented in FIG. 4, in which the capacitor Ca is added, the capacitance of the capacitor Ca and the resistance value of the first resistor R21 are adjusted so that the dI/dt of the electric current that flows between the drain DR1 and the source SO1 of the power semiconductor device 1 becomes equal to that in the case of the driving circuit 643, in FIG. 2, in which no capacitor is added. In FIG. 5, the electric currents 405 and 406 that each flow between the drain and the source coincide with each other; this suggests that the both electric currents change in one and the same manner.

A turn-on signal is inputted; the first switch S1 is turned on; the gate voltage starts to increase, as represented by the line 401 or 402; when the gate voltage 401 or 402 exceeds a threshold voltage, the electric current flowing between the drain DR1 and the source SO1 increases. Because although the capacitor Ca is added in the driving circuit 243 according to Embodiment 2, the capacitance of the capacitor Ca and the resistance value of the first resistor R21 are adjusted so that the charge time constant becomes equal to that in the case of the driving circuit 643 in FIG. 2, the respective waveforms of the gate voltages 401 and 402 are the same as each other. At this moment, the dI/dt of the electric current that flows between the drain DR1 and the source SO1 depends on the gate voltage 401 or 402. Therefore, the dI/dt of the electric current 406 that flows between the drain DR1 and the source SO1 in the driving circuit 243, according to Embodiment 2, where the capacitor Ca is added becomes the same as the dI/dt of the electric current 405 that flows between the drain DR1 and the source SO1 in the driving circuit 643, as a comparative example, where no capacitor is added.

When the gate voltage 401 or 402 further increases and then reaches the mirror voltage, the drain-to-source voltage 403 or 404, as the case may be, starts to decrease. In this situation, the parasitic capacitance between the gate G1 and the drain DR1 of the power semiconductor device 1 largely changes as the voltage 403 or 404 between the drain DR1 and the source SO1 changes. At this moment, the mirror period starts in which most of the gate current passes through the path for charging the parasitic capacitance between the gate G1 and the drain DR1. In the mirror period, the gate voltage hardly changes; thus, the electric current that charges the capacity Ca hardly flows in this period. In this situation, the resistance value of the first resistor R21 in Embodiment 2 is smaller than that of the resistor R20 in the comparative example. In contrast, the parasitic capacitance between the gate G1 and the drain DR1 is one and the same whether or not the capacitor Ca is added, and the electric current hardly flows to the capacitor Ca; therefore, the charge time constant in Embodiment 2 in which the capacitor Ca is added is smaller than that in the comparative example in which no capacitor is added; thus, the charging time in the mirror period becomes shorter. As described above, Embodiment 2 according to the present invention, in which the capacitor Ca is added, makes the dV/dt of the drain-to-source voltage 404 larger than the dV/dt of the drain-to-source voltage 403. After the mirror period, each of the gate voltages 401 and 402 starts to increase. In this situation, the respective charge time constants for charging the parasitic capacitance between the gate and the source are one and the same; thus, the respective waveforms of the gate voltages 401 and 402 are the same as each other.

In the above description, there has been explained an example in which the resistance value of the first resistor R21 and the capacitance of the capacitor Ca are adjusted so that the turn-on-mode dI/dt of the power semiconductor device 1 becomes equal to that in the case of the driving circuit 643, which is a comparative example represented in FIG. 2. In this regard, however, it is not necessarily required to perform the adjustment in this manner; the power semiconductor device driving circuit according to Embodiment 2 of the present invention is characterized in that because it is made possible to freely select the capacitance of the capacitor Ca and the resistance value of the first resistor R21, the turn-on-mode switching speed can be raised without changing the turn-off-mode switching speed and hence the switching loss can be reduced. Furthermore, it is made possible to change only dV/dt without changing turn-on-mode dI/dt. Therefore, even when the turn-on-mode dI/dt is limited, it is made possible that the turn-on-mode dV/dt is increased without affecting the turn-off mode and hence switching loss in the self-arc-extinguishing power semiconductor device is reduced.

The current change dI/dt is limited by noise, the short-circuit tolerance, the diode recovery, or the like. For example, the short-circuit tolerance will be considered. Because when the dI/dt is large, a large electric current flows before a short-circuit protection circuit implements its protection operation, the short-circuit tolerance is exceeded and the device is broken; therefore, the dI/dt is limited. Next, the diode recovery will be considered. When a power semiconductor device turns on while a reflux current flows, the free-wheeling-diode (FWD), connected in an anti-parallel manner with the power semiconductor device, that has been biased in a forward direction becomes biased in a reverse direction. However, the PN junction cannot immediately be transferred from the carrier-saturated state to the reversely-biased state. Therefore, electrons and holes in the accumulated excessive carriers are exhausted through the N+ layer and the P layer, respectively, from the PN junction portion, as a starting point, where the depletion layer firstly recovers; then, an electric current continues to flow until the carriers finally disappear due to recombination. A large dI/dt makes the peak value of the reverse recovery current and the amount of reverse recovery electric charge increase; thus, the self-arc-extinguishing power semiconductor device may be broken due to an increase in the switching loss and a surge voltage. Accordingly, it is required to limit the dI/dt.

Embodiment 3

Figure 6:
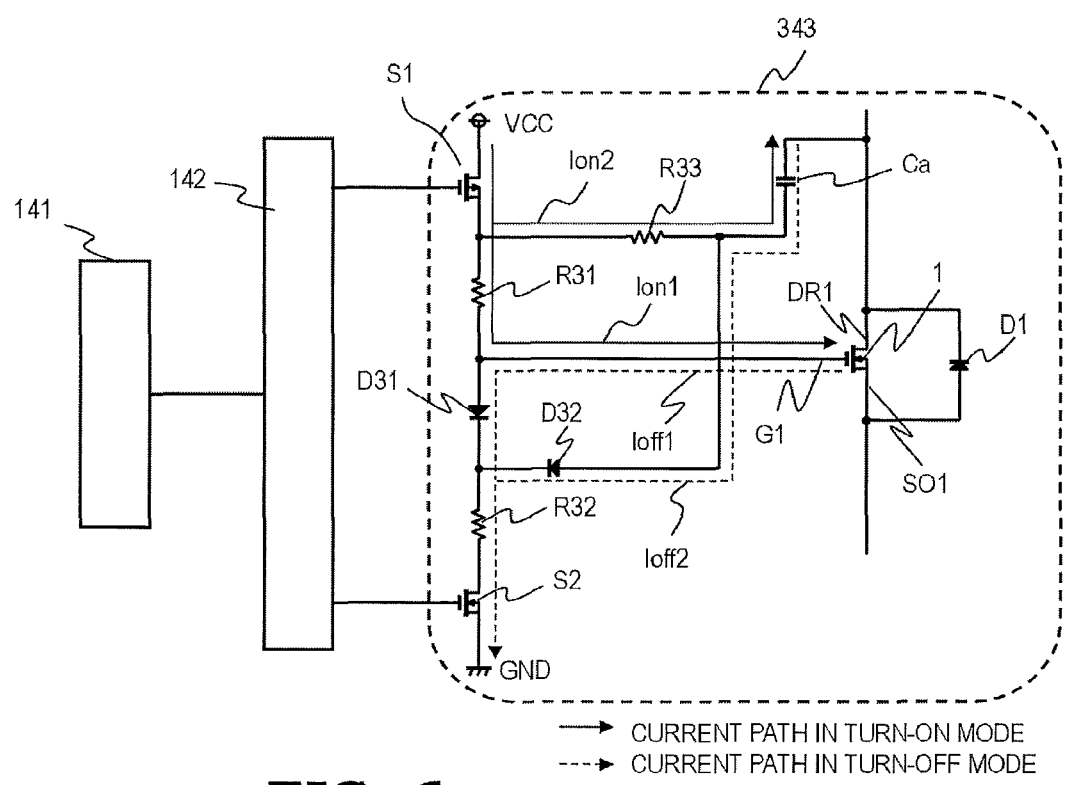
FIG. 6 is a circuit diagram representing a power semiconductor device driving circuit according to Embodiment 3 of the present invention.

FIG. 6 is a circuit diagram representing a power semiconductor device driving circuit according to Embodiment 3 of the present invention. In FIG. 6, a signal from the control signal output circuit 141 is transmitted by way of the insulating circuit 142. The transmitted signal turns on one of the first switch S1 and the second switch S2; the electric potential at the gate G1 of the self-arc-extinguishing power semiconductor device 1 is changed; then, the power semiconductor device 1 is driven.

The first switch S1, a first resistor R31, a first diode D31, a second resistor R32, and the second switch S2 are connected in series and in that order between the output terminals VCC and GND of the control power source. The first diode D31 is connected in the forward direction with respect to the control power source. The gate G1, which is the control electrode of the power semiconductor device 1, is connected with the connection point between the first resistor R31 and the anode of the first diode D31. One end of the capacitor Ca is connected with the drain DR1, which is the first main electrode of the power semiconductor device 1; the other end of the capacitor Ca is connected with one end of a third resistor R33 whose other end is connected with the connection point between the first switch S1 and the first resistor R31. The anode of a second diode D32 is connected with the connection point between the capacitor Ca and the third resistor R33; the cathode of the second diode D32 is connected with the connection point between the cathode of the first diode D31 and the second resistor R32. The diode D1 is connected in parallel with the power semiconductor device 1. That is to say, the cathode and the anode of the diode D1 are connected with the drain DR1 and the source SO1, respectively, of the power semiconductor device 1. The gate of the first switch S1 and the gate of the second switch S2 are connected with the insulating circuit 142; the insulating circuit 142 is connected with the control signal output circuit 141.

The operation, at a time when the self-arc-extinguishing power semiconductor device 1 turns on, of the power semiconductor device driving circuit according to Embodiment 3 of the present invention, configured in such a manner as described above, will be explained. In a driving circuit 343, when the first switch S1 turns on, i.e., in the turn-on mode thereof, respective electric currents flow in a path Ion1 for charging the gate G1 with electric charges by way of the first switch S1 and the first resistor R31 and in a path Ion2 for charging the capacitor Ca with electric charges by way of the first switch S1 and the third resistor R33. In this situation, the parasitic capacitance between the gate G1 and the drain DR1 of the self-arc-extinguishing power semiconductor device 1 and the capacitor Ca are charged through respective different resistors; therefore, the capacitor Ca hardly affects charging the parasitic capacitance between the gate G1 and the drain DR1 of the self-arc-extinguishing power semiconductor device 1. Thus, the capacitor Ca hardly affects the turn-on-mode dV/dt, dI/dt, and switching loss of the power semiconductor device 1.

Next, the operation at a time when the power semiconductor device 1 turns off will be explained. In the driving circuit 343, when the second switch S2 turns on, i.e., in the turn-off mode thereof, electric currents flow in a path Ioff1 for discharging electric charges from the gate G1 by way of the first diode D31, the second resistor R32, and the second switch S2 that are connected in series and in a path Ioff2 for discharging electric charges from the capacitor Ca by way of the second diode D32, the second resistor R32, and the second switch S2 that are connected in series; as a result, electric charges are discharged from the capacitor Ca and the parasitic capacitance between the gate G1 and the drain DR1 of the power semiconductor device 1. In this situation, in order to lower the voltage at the gate G1, it is required to discharge electric charges stored in the capacitance obtained by adding the capacitance of the capacitor Ca and the capacitance of the parasitic capacitance between the gate G1 and the drain DR1 of the power semiconductor device 1, because the capacitor Ca is connected in parallel with the parasitic capacitance between the gate G1 and the drain DR1 of the power semiconductor device 1. When the capacitor Ca is just simply added, the amount of electric charge to be discharged increases; thus, the switching speed is lowered. In Embodiment 3 of the present invention, the turn-off-mode switching speed can be adjusted by adjusting the capacitance of the capacitor Ca and the resistance value of the second resistor R32. In this description, as an example, there will be explained the case where the capacitance of the capacitor Ca and the resistance value of the second resistor R32 are adjusted so that the turn-off-mode dv/dt of the power semiconductor device 1 becomes equal to the turn-off-mode dv/dt of the power semiconductor device 1 in the driving circuit 643, as a comparative example represented in FIG. 2, in which no capacitor Ca is added. That is to say, the adjustment is performed so that the time constant determined by the resistor R20 in FIG. 2 and the turn-off-mode capacitance of the gate G1 of the power semiconductor device 1 becomes equal to the time constant determined by the second resistor R32 in FIG. 6, the turn-off-mode capacitance of the gate G1 of the power semiconductor device 1, and the capacitance of the capacitor Ca. By performing the adjustment in this manner, the resistance value of the second resistor R32 in FIG. 6 according to Embodiment 3 becomes smaller than that of the resistor R20 in the comparative example in FIG. 2.

Figure 7:
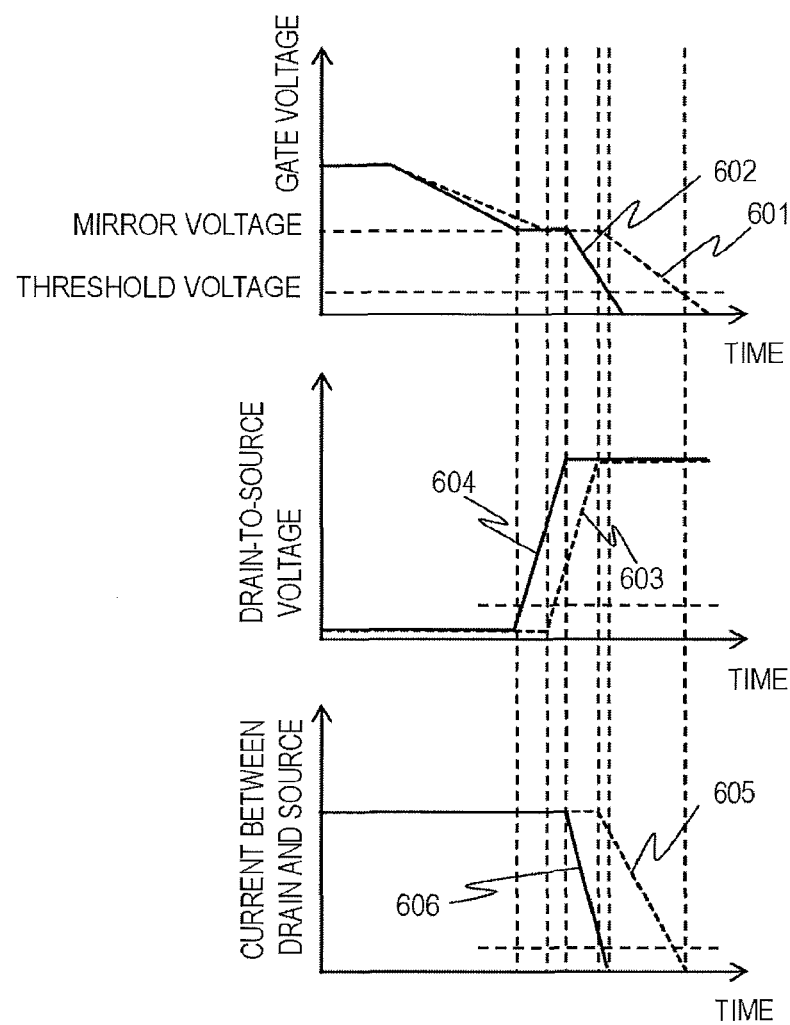
FIG. 7 is a set of schematic waveform charts for explaining the turn-off-mode operation of the power semiconductor device driving circuit according to Embodiment 3 of the present invention.

FIG. 7 is a set of schematic waveform charts for explaining the turn-off-mode operation of the power semiconductor device driving circuit, represented in FIG. 6, according to Embodiment 3 of the present invention. Broken lines 601, 603, and 605 represent the voltage at the gate G1 of the power semiconductor device 1 in the driving circuit 643 in FIG. 2, which is a comparative example in which no capacitor is added, the voltage between the drain DR1 and the source SO1, and the electric current that flows between the drain DR1 and the source SO1, respectively. In contrast, solid lines 602, 604, and 606 represent the voltage at the gate G1 of the power semiconductor device 1, the voltage between the drain DR1 and the source SO1, and the electric current that flows between the drain DR1 and the source SO1, respectively, at a time when in the circuit according to Embodiment 3, represented in FIG. 6, in which the capacitor Ca is added, the capacitance of the capacitor Ca and the resistance value of the second resistor R32 are adjusted so that dv/dt of the electric current that flows between the drain DR1 and the source SO1 becomes equal to that in the case of the driving circuit 643, in FIG. 2, in which no capacitor is added.

A turn-off signal is inputted; the second switch S2 is turned on; then, the gate voltage starts to decrease, as represented by the line 601 or 602. In this situation, the gate current flows through the path for discharging the parasitic capacitance between the gate G1 and the source SO1 of the power semiconductor device 1. Because the second resistor R32 is adjusted, the discharge time constant in Embodiment 3 in which the capacitor Ca is added is smaller than that in FIG. 2 in which no capacitor is added; therefore, the gate voltage 602 in Embodiment 3 in which the capacitor Ca is added falls faster than the gate voltage 601 in the comparative example in which the capacitor Ca is not added. When the gate voltage 601 or 602 further decreases and then reaches the mirror voltage, the drain-to-source voltage 603 or 604, as the case may be, starts to increase. In this situation, the parasitic capacitance between the gate G1 and the drain DR1 of the power semiconductor device 1 largely changes as the voltage 603 or 604 between the drain DR1 and the source SO1 changes. In this situation, the mirror period starts in which most of the gate current passes through the path for discharging the capacitor Ca and the parasitic capacitance between the gate G1 and the drain DR1. In Embodiment 3, because the capacitance of the capacitor Ca and the resistance value of the second resistor R32 are adjusted, the discharge time constant of the comparative example in which no capacitor is added, i.e., the discharge time in the mirror period becomes the same; thus, the dV/dt of the voltage 603 between the drain DR1 and the source SO1 of the power semiconductor device 1 in the comparative example in which no capacitor is added becomes equal to the dV/dt of the voltage 604 between the drain DR1 and the source SO1 of the power semiconductor device 1 in Embodiment 3 in which the capacitor Ca is added.

After the mirror period, each of the gate voltages 601 and 602 starts to decrease and hence the electric current that flows between the drain DR1 and the source SO1 decreases. At this moment, the dI/dt of the electric current that flows between the drain DR1 and the source SO1 depends on the gate voltage. Because the present timing is after the mirror period, the discharge time constant for discharging the gate-to-source parasitic capacitance is smaller than that in the comparative example in which the capacitor Ca is not added; therefore, the gate voltage 602 in Embodiment 3 in which the capacitor Ca is added falls faster than the gate voltage 601 in the comparative example in which the capacitor Ca is not added. Therefore, the dI/dt of the electric current 606 that flows between the drain DR1 and the source SO1 in Embodiment 3 where the capacitor Ca is added becomes larger than the dI/dt of the electric current 605 that flows between the drain DR1 and the source SO1 in the comparative example where the capacitor Ca is not added.

In this description, as an example, there has been explained the case where the capacitance of the capacitor Ca and the resistance value of the second resistor R32 are adjusted so that the turn-off-mode dv/dt of the power semiconductor device 1 becomes equal to the turn-off-mode dv/dt of the power semiconductor device 1 in the driving circuit 643, which is a comparative example represented in FIG. 2. In this regard, however, it is not necessarily required to perform the adjustment in this manner; because in the power semiconductor device driving circuit according to Embodiment 3 of the present invention, it is made possible to freely select the capacitance of the capacitor Ca and the resistance value of the second resistor R32, the turn-off-mode switching speed can be raised without changing the turn-on-mode switching speed and hence the switching loss is reduced. Furthermore, it is made possible to change only dI/dt without changing turn-off-mode dV/dt; therefore, even when turn-off-mode dV/dt is limited due to noise or the like, it is made possible that the turn-off-mode dI/dt is increased without affecting the turn-on mode and hence switching loss in the power semiconductor device 1 is reduced.

Embodiment 4

Figure 8:
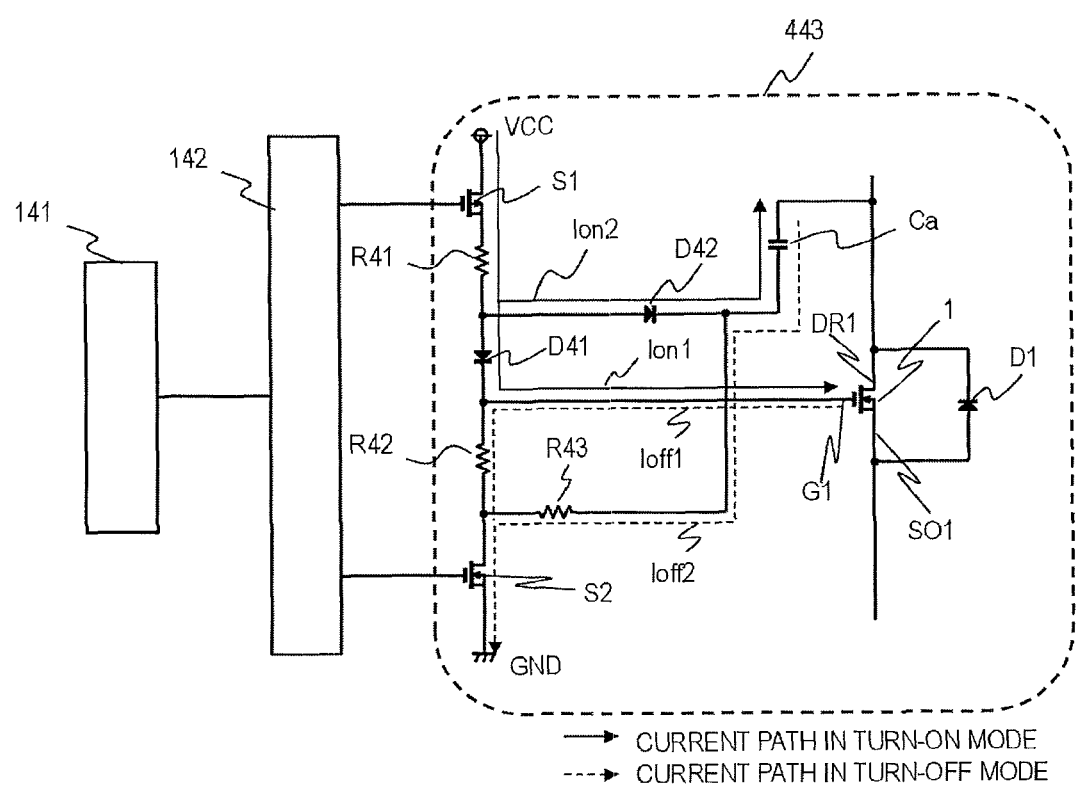
FIG. 8 is a circuit diagram representing a power semiconductor device driving circuit according to Embodiment 4 of the present invention.

FIG. 8 is a circuit diagram representing a power semiconductor device driving circuit according to Embodiment 4 of the present invention. In FIG. 8, a signal from the control signal output circuit 141 is transmitted by way of the insulating circuit 142. The transmitted signal turns on one of the first switch S1 and the second switch S2; the electric potential at the gate G1 of the self-arc-extinguishing power semiconductor device 1 is changed; then, the power semiconductor device 1 is driven.

The first switch S1, a first resistor R41, a first diode D41, a second resistor R42, and the second switch S2 are connected in series and in that order between the output terminals VCC and GND of the control power source. The first diode D41 is connected in the forward direction with respect to the control power source. The gate G1, which is the control electrode of the power semiconductor device 1, is connected with the connection point between the second resistor R42 and the cathode of the first diode D41. One end of the capacitor Ca is connected with the drain DR1, which is the first main electrode of the power semiconductor device 1; the other end of the capacitor Ca is connected with the cathode of a second diode D42 whose anode is connected with the connection point between the anode of the first diode D41 and the first resistor R41. One end of a third resistor R43 is connected with the connection point between the anode of the second diode D42 and the capacitor Ca; the other end of the third resistor R43 is connected with the connection point between the second resistor R42 and the second switch S2. The diode D1 is connected in parallel with the power semiconductor device 1. That is to say, the cathode and the anode of the diode D1 are connected with the drain DR1 and the source SO1, respectively, of the power semiconductor device 1. The gate of the first switch S1 and the gate of the second switch S2 are connected with the insulating circuit 142; the insulating circuit 142 is connected with the control signal output circuit 141.

The operation, at a time when the power semiconductor device 1 turns off, of a power semiconductor device driving circuit 443 according to Embodiment 4 of the present invention, configured in such a manner as described above, will be explained. In the driving circuit 443, when the second switch S2 turns on, i.e., in the turn-off mode thereof, respective electric currents flow in a path Ioff1 for discharging electric charges from the gate G1 by way of the second resistor R42 and the second switch S2 and in a path Ioff2 for discharging electric charges from the capacitor Ca by way of the third resistor R43 and the second switch S2. In this situation, the parasitic capacitance between the gate G1 and the drain DR1 of the power semiconductor device 1 and the capacitor Ca are charged through respective different resistors; therefore, the capacitor Ca hardly affects charging the parasitic capacitance between the gate G1 and the drain DR1 of the power semiconductor device 1. Thus, the capacitor Ca hardly affects the turn-on-mode dV/dt, dI/dt, and switching loss of the power semiconductor device 1.

Next, the operation at a time when the power semiconductor device 1 turns on will be explained. In the driving circuit 443, when the first switch S1 turns on, i.e., in the turn-on mode thereof, respective electric currents flow in a path Ion1 for charging the gate G1 with electric charges by way of the first switch S1, the first resistor R41, and the first diode D41 in that order and in a path Ion2 for charging the capacitor Ca with electric charges by way of the first switch S1, the first resistor R41, and the second diode D42 in that order; as a result, the capacitor Ca and the parasitic capacitance between the gate G1 and the drain DR1 of the power semiconductor device 1 are charged. In this situation, in order to raise the voltage at the gate G1, it is required to charge the capacitance obtained by adding the capacitance of the capacitor Ca and the capacitance of the parasitic capacitance between the gate G1 and the drain DR1, because the capacitor Ca is connected in parallel with the parasitic capacitance between the gate G1 and the drain DR1 of the power semiconductor device 1. When the capacitor Ca is just simply added, the amount of electric charge to be charged increases; thus, the switching speed is lowered. In Embodiment 4 of the present invention, the capacitance of the capacitor Ca and the resistance value of the first resistor R41 are adjusted so that the turn-off-mode dV/dt of the power semiconductor device becomes equal to the turn-off-mode dV/dt of the power semiconductor device 1 at a time when the capacitor Ca is not added, i.e., the turn-off-mode dV/dt in the case of the driving circuit 643, which is the comparative example represented in FIG. 2. By performing the adjustment in this manner, the resistance value of the first resistor R41 in FIG. 8 according to Embodiment 4 becomes smaller than that of the resistor R20 in the comparative example represented in FIG. 2.

Figure 9:
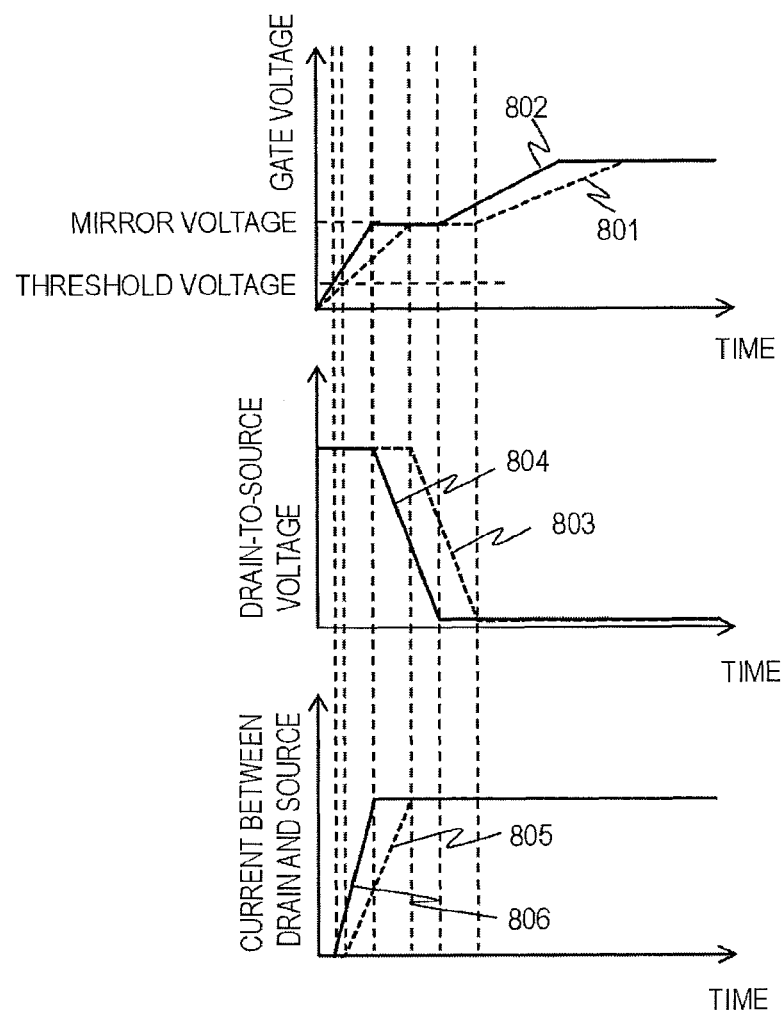
FIG. 9 is a set of schematic waveform charts for explaining the turn-on-mode operation of the power semiconductor device driving circuit according to Embodiment 4 of the present invention.

FIG. 9 is a set of schematic waveform charts for explaining the turn-on-mode operation of the power semiconductor device driving circuit according to Embodiment 4 of the present invention. Broken lines 801, 803, and 805 represent the voltage at the gate G1 of the power semiconductor device 1 in the driving circuit 643 in FIG. 2, which is a comparative example in which no capacitor is added, the voltage between the drain DR1 and the source SO1, and the electric current that flows between the drain DR1 and the source SO1, respectively. In contrast, solid lines 802, 804, and 806 represent the voltage at the gate G1 of the power semiconductor device 1, the voltage between the drain DR1 and the source SO1, and the electric current that flows between the drain DR1 and the source 501, respectively, at a time when in the circuit according to Embodiment 4, represented in FIG. 8, in which the capacitor Ca is added, the capacitance of the capacitor Ca and the resistance value of the first resistor R41 are adjusted so that the dV/dt of the voltage between the drain DR1 and the source 501 becomes equal to that in the case of the driving circuit 643 in FIG. 2, in which no capacitor is added.

A turn-on signal is inputted; the first switch S1 is turned on; the gate voltage starts to increase, as represented by the line 801 or 802; when the gate voltage 801 or 802 exceeds a threshold voltage, the electric current flowing between the drain DR1 and the source SO1 increases. In this situation, most of the gate current flows through the path for charging the parasitic capacitance between the gate G1 and the source SO1 of the power semiconductor device 1. The capacitance of the capacitor Ca and the resistance value of the first resistor R41 are adjusted so that the dV/dt of the voltage between the drain DR1 and the source SO1 of the power semiconductor device 1 becomes equal to that in the case of the driving circuit 643 in FIG. 2, in which no capacitor is added; therefore, the charge time constant in Embodiment 4 where the capacitor Ca is added is smaller than that in the comparative example where no capacitor is added. Accordingly, the gate voltage 802 in Embodiment 4 where the capacitor Ca is added increases faster than the gate voltage 801 in the comparative example where no capacitor is added. At this moment, the dI/dt of the electric current that flows between the drain DR1 and the source SO1 depends on the gate voltage. Therefore, the dI/dt of the electric current 806 that flows between the drain DR1 and the source SO1 in Embodiment 4 where the capacitor Ca is added becomes larger than the dI/dt of the electric current 805 that flows between the drain DR1 and the source SO1 in the comparative example where the capacitor Ca is not added.

When the gate voltage 801 or 802 further increases and then reaches the mirror voltage, the drain-to-source voltage 803 or 804, as the case may be, starts to decrease. In this situation, the parasitic capacitance between the gate G1 and the drain DR1 of the power semiconductor device 1 largely changes as the voltage 803 or 804 between the drain DR1 and the source SO1 changes. At this moment, the mirror period starts in which most of the gate current passes through the path for charging the capacitor Ca and the parasitic capacitance between the gate G1 and the drain DR1. In the mirror period, the gate voltage hardly changes; thus, the electric current that charges the capacity Ca hardly flows in this period. The capacitance of the capacitor Ca and the resistance value of the first resistor R41 are adjusted so that the dV/dt of the voltage between the drain DR1 and the source SO1 of the power semiconductor device 1 becomes equal to that in the case of the driving circuit 643 in FIG. 2, in which no capacitor is added; therefore, the charge time constant is one and the same and hence the charging time is also one and the same, whether or not the capacitor Ca is added. Accordingly, the dV/dt of the voltage 804 between the drain and the source is equal to that of the voltage 803 between the drain and the source. After the mirror period, each of the gate voltages 801 and 802 starts to increase. At this moment, the gate current passes through the path for charging the parasitic capacitance between the gate G1 and the source SO1 of the power semiconductor device 1; however, because the resistance value of the first resistor R41 is smaller than that of the resistor R20 in the comparative example in FIG. 2 where no capacitor is added, the charge time constant in Embodiment 4 where the capacitor Ca is added is smaller than that in the comparative example where no capacitor Ca is added; therefore, the gate voltage 802 in Embodiment 4 in which the capacitor Ca is added increases faster than the gate voltage 801 in the comparative example where no capacitor is added.

In the above description, there has been explained an example in which the resistance value of the first resistor R41 and the capacitance of the capacitor Ca are adjusted so that the dV/dt of the voltage between the drain DR1 and the source SO1 of the power semiconductor device 1 becomes equal to that in the case of the driving circuit 643 in FIG. 2. In this regard, however, it is not necessarily required to perform the adjustment in this manner; because in the power semiconductor device driving circuit according to Embodiment 4 of the present invention, it is made possible to freely select the capacitance of the capacitor Ca and the resistance value of the first resistor R41, the turn-on-mode switching speed can be raised without changing the turn-off-mode switching speed and hence the switching loss can be reduced. Furthermore, it is made possible to change only dI/dt without changing turn-on-mode dV/dt; therefore, even when turn-on-mode dV/dt is limited due to noise or the like, it is made possible that the turn-on-mode dI/dt is increased without affecting the turn-off mode and hence switching loss in the power semiconductor device 1 is reduced.

Embodiment 5

Figure 10:
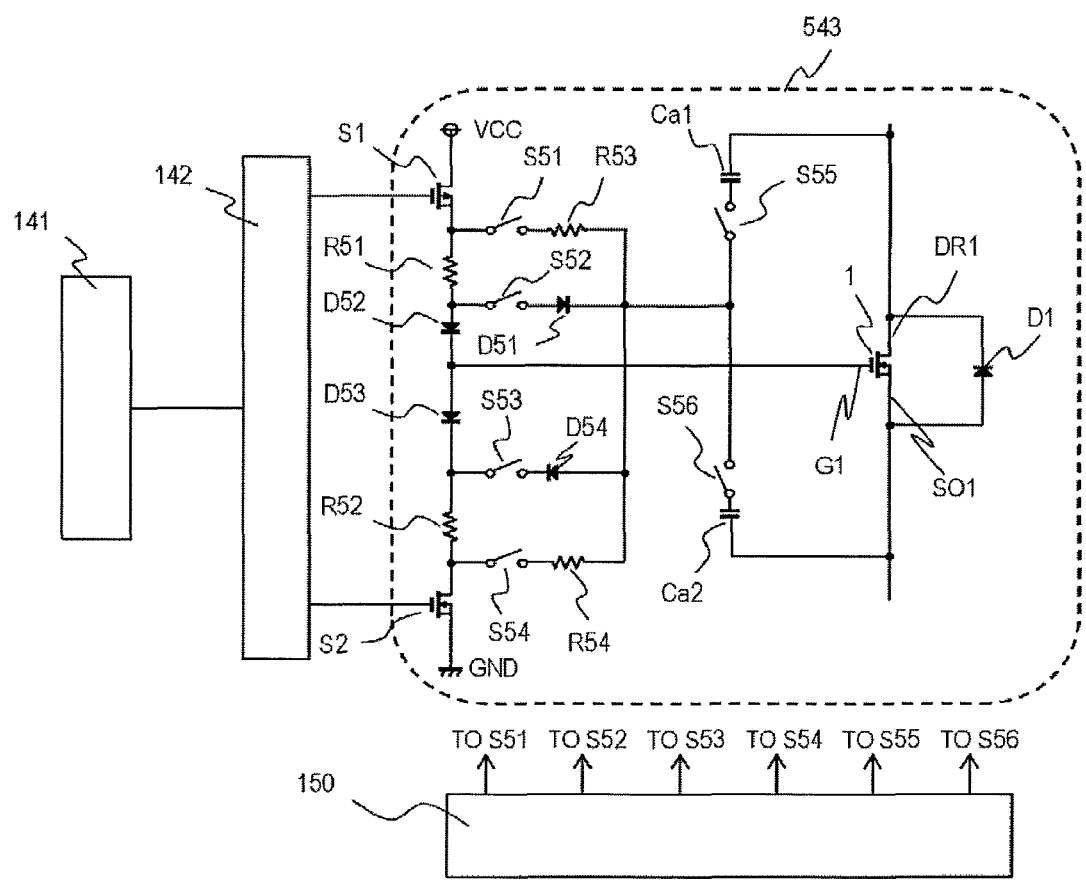
FIG. 10 is a circuit diagram representing a power semiconductor device driving circuit according to Embodiment 5 of the present invention.

FIG. 10 is a circuit diagram representing a power semiconductor device driving circuit 543 according to Embodiment 5 of the present invention. In FIG. 10, a signal from the control signal output circuit 141 is transmitted by way of the insulating circuit 142. The transmitted signal turns on one of the first switch S1 and the second switch S2; the electric potential at the gate G1 of the self-arc-extinguishing power semiconductor device 1 is changed; then, the power semiconductor device 1 is driven. The circuit in FIG. 10 is configured in such a way that it is made possible to change over to any one of the foregoing circuits according to Embodiments 1 through 4 by changing over the on/off combinations of a first changeover switch S51, a second changeover switch S52, a third changeover switch S53, a fourth changeover switch S54, a fifth changeover switch S55, and a sixth changeover switch S56.

For example, a circuit that is equivalent to the driving circuit 143 in FIG. 1 according to Embodiment 1 is configured by turning on the first changeover switch S51, the fourth changeover switch S54, and the sixth changeover switch S56 and turning off the other changeover switches S52, S53, and S55. In other words, the resistors R51, R52, and R53, the diodes D53 and D54, and the second capacitor Ca2 are the elements that correspond to the first resistor R11, the second resistor R12, and the third resistor R13, the first diode D11, the second diode D12, and the capacitor Ca, respectively, in FIG. 1. Although connected, the diode D52 does not affect the operation of this circuit.

A circuit that is equivalent to the driving circuit 243 in FIG. 4 according to Embodiment 2 is configured by turning on the second changeover switch S52, the fourth changeover switch S54, and the sixth changeover switch S56 and turning off the other changeover switches S51, S53, and S55. In other words, the resistors R51 and R52, a resistor R54, the diodes D51 and D52, and the second capacitor Ca2 are the elements that correspond to the first resistor R21, the second resistor R22, and the third resistor R23, the second diode D22, the first diode D21, and the capacitor Ca, respectively, in FIG. 4. Although connected, the diode D53 does not affect the operation of this circuit.

A circuit that is equivalent to the driving circuit 343 in FIG. 6 according to Embodiment 3 is configured by turning on the first changeover switch S51, the third changeover switch S53, and the fifth changeover switch S55 and turning off the other changeover switches S52, S54, and S56. In other words, the resistors R51, R52, and R53, the diodes D53 and D54, and a first capacitor Ca1 are the elements that correspond to the first resistor R31, the second resistor R32, and the third resistor R33, the first diode D31, the second diode D32, and the capacitor Ca, respectively, in FIG. 6. Although connected, the diode D52 does not affect the operation of this circuit.

A circuit that is equivalent to the driving circuit 443 in FIG. 8 according to Embodiment 4 is configured by turning on the second changeover switch S52, the fourth changeover switch S54, and the fifth changeover switch S55 and turning off the other changeover switches S51, S53, and S56. In other words, the resistors R51, R52, and R54, the diodes D51 and D52, and the first capacitor Ca1 are the elements that correspond to the first resistor R41, the second resistor R42, and the third resistor R43, the first diode D41, the second diode D42, and the capacitor Ca, respectively, in FIG. 8. Although connected, the diode D53 does not affect the operation of this circuit.

The descriptions heretofore will be summarized below. At first, let's refer to the resistor R51, the resistor R52, the resistor R53, the resistor R54, the diode D52, the diode D53, the diode D51, and the diode D54 as a first resistor, a second resistor, a first third resistor, a second third resistor, a first first diode, a second first diode, a first second diode, and a second second diode, respectively. It goes without saying that the changeover switch and the element in each of the series units may be connected with each other in a manner that is opposite to the manner represented in FIG. 10. The following is the description, for the circuit configuration of the driving circuit 543 in FIG. 10, that is made while considering the foregoing matters.

One end of the first switch S1 is connected with the positive output terminal VCC of the control power source, and one end of the second switch S2 is connected with the negative output terminal GND of the control power source; the first resistor R51, the first first diode D52, the second first diode D53, and the second resistor R52 are connected in series and in that order between the other terminal of the first switch S1 and the other end of the second switch S2; the control electrode G1 of the power semiconductor device 1 is connected with the connection point between the first first diode D52 and the second first diode D53; one end of the series unit consisting of the first capacitor Ca1 and the fifth changeover switch S55 is connected with one of the main electrodes of the power semiconductor device 1; one end of the series unit consisting of the second capacitor Ca2 and the sixth changeover switch S56 is connected with the other one of the main electrodes of the power semiconductor device 1; the other end of the series unit consisting of the first capacitor Ca1 and the fifth changeover switch S55 and the other end of the series unit consisting of the second capacitor Ca2 and the sixth changeover switch S56 are connected with each other at a point, which is a capacitor-changeover connection point; the series unit consisting of the first changeover switch S51 and the first third resistor R53 is connected between the capacitor-changeover connection point and the other end of the first switch S1; the series unit consisting of the second changeover switch S52 and the first second diode D51 is connected between the capacitor-changeover connection point and the connection point between the first resistor R51 and the first first diode D52 in such a way that the direction in which the capacitor-changeover connection point is charged through the first second diode D51 is the forward direction of the first second diode D51; the series unit consisting of the third changeover switch S53 and the second second diode D54 is connected between the capacitor-changeover connection point and the connection point between the second resistor R52 and the second first diode D53 in such a way that the direction in which the capacitor-changeover connection point is discharged through the second second diode D54 is the forward direction of the second second diode D54; the series unit consisting of the fourth changeover switch S54 and the second third resistor R54 is connected between the connection point between the second resistor R52 and the other end of the second switch S2 and the capacitor-changeover connection point; any one of the first changeover switch S51 and the second changeover switch S52 is on; as far as the third changeover switch S53 and the fourth changeover switch S54 are concerned, the third changeover switch S53 turns on when the first changeover switch S51 is on, and the fourth changeover switch S54 turns on when the second changeover switch S52 is on; any one of the fifth changeover switch S55 and the sixth changeover switch S56 is on. As a result, the driving circuit in FIG. 10 is configured in the same manner as any one of the driving circuits in FIGS. 1, 4, 6, and 8.

Each of the changeover switches S51, S52, S53, S54, S55, and S56 may be either an electronic switch such as a semiconductor switch or a switch such as a relay having a physical contact. Each of the changeover switches S51, S52, S53, S54, S55, and S56 may also be a manual switch. FIG. 10 represents that each of the changeover switches are controlled by a command from a changeover switch controller 150; however, it may be allowed that the changeover switch controller 150 is not provided and each of the changeover switches is preliminarily set to be on or off in a manual manner before the driving circuit 543 is operated.

As described above, by changing over the on/off state of each of the six switches including the first through sixth changeover switches, the circuit in FIG. 10 can be configured as any one of the circuits according to embodiments 1 through 4. Accordingly, a circuit capable of raising the turn-off-mode switching speed without changing the turn-on-mode switching speed can be configured or a circuit capable of raising the turn-on-mode switching speed without changing the turn-off-mode switching speed can be configured; thus, because selection of and changing over to an appropriate circuit can be performed based on the operation mode of the power semiconductor device 1, the switching loss can be reduced in accordance with the operation mode of the power semiconductor device 1.

By summarizing above-mentioned Embodiments 1 through 5, the present invention can be described as follows.

A driving circuit for a power semiconductor device 1 having a first main electrode (DR1 or SO1), a second main electrode (SO1 or DR1), and a control electrode G1 that controls an electric current flowing between the first main electrode and the second main electrode is provided with a capacitor Ca whose one end is connected with the first main electrode or the second main electrode, a first switch S1 for charging the control electrode G1 and the capacitor Ca with electric charges, and a second switch S2 for discharging electric charges from the control electrode G1 and the capacitor Ca; in any one of the cases where the first switch is turned on and then the control electrode G1 and the capacitor Ca are charged with electric charges and where the second switch is turned on and then electric charges are discharged from the control electrode G1 and the capacitor Ca, the resistor through which electric charges to or from the control electrode G1 pass is different from the resistor through which electric charges to or from the capacitor Ca pass (in the case of Embodiment 1, the resistors R11 and R13 in the charging mode; in the case of Embodiment 2, the resistors R22 and R23 in the discharging mode; in the case of Embodiment 3, the resistors R31 and R33 in the charging mode; in the case of Embodiment 4, the resistors R42 and R43 in the discharging mode; in the case of Embodiment 5, the resistors R51 and R53 in the charging mode or the resistors R52 and R54 in the discharging mode); when the first switch S1 is turned on and then electric charges to be charged into the control electrode G1 and electric charges to be charged into the capacitor Ca pass through respective different resistors (in the case of Embodiments 1 and 3 and in the case where in Embodiment 5, the on/off states of changeover switches are set in such a way that the configuration is the same as that of Embodiment 1 or 3), the resistor through which electric charges from the control electrode G1 pass is one and the same as the resistor through which electric charges from the capacitor Ca pass (in the case of Embodiments 1, 3, and 5, the resistors R12, R32, and R52, respectively) when the second switch S2 is turned on and then electric charges are discharged from the control electrode G1 and the capacitor Ca; when the second switch S2 is turned on and then electric charges to be discharged from the control electrode G1 and electric charges to be discharged from the capacitor Ca pass through respective different resistors (in the case of Embodiments 2 and 4 and in the case where in Embodiment 5, the on/off states of changeover switches are set in such away that the configuration is the same as that of Embodiment 2 or 4), the resistor through which electric charges to the control electrode G1 pass is one and the same as the resistor through which electric charges to the capacitor Ca pass (in the case of Embodiments 2, 4, and 5, the resistors R12, R41, and R51, respectively) when the first switch S1 is turned on and then the control electrode G1 and the capacitor Ca are charged with electric charges.

DESCRIPTION OF REFERENCE NUMERALS

1: power semiconductor device
Ca: capacitor
Ca1: first capacitor
Ca2: second capacitor
D11, D21, D31, D41: first diode
D52: first first diode
D53: second first diode
D12, D22, D32, D42: second diode
D51: first second diode
D54: second second diode
G1: gate (control electrode)
DR1: drain (first main electrode)
SO1: source (second main electrode)
R11, R21, R31, R41, R51: first resistor
R12, R22, R32, R42, R52: second resistor
R13, R23, R33, R43: third resistor
R53: first third resistor
R54: second third resistor
S1: first switch
S2: second switch
S51: first changeover switch
S52: second changeover switch
S53: third changeover switch
S54: fourth changeover switch
S55: fifth changeover switch
S56: sixth changeover switch

The invention claimed is:
1. A power semiconductor device driving circuit for a power semiconductor device having a first main electrode, a second main electrode, and a control electrode for controlling an electric current flowing between the first main electrode and the second main electrode, the power semiconductor device driving circuit comprising:
a capacitor whose one end is connected with the first main electrode or the second main electrode;

a first switch that is provided for charging the control electrode and the capacitor with electric charges and whose one end is connected with a positive output terminal of a control power source; and a second switch that is provided for discharging electric charges from the control electrode and the capacitor and whose one end is connected with a negative output terminal of the control power source, wherein a first resistor, a first diode, and a second resistor are connected in series and in that order between the other end of the first switch and the other end of the second switch, and the first diode is connected forward with respect to the control power source, wherein in any one of the cases where the first switch is turned on and then the control electrode is charged with electric charges through the first resistor and the capacitor is arc charged with electric charges and where the second switch is turned on and then electric charges are discharged from the control electrode through the second resistor and electric charges are discharged from the capacitor, a resistor through which electric charges to or from the control electrode pass is different from a resistor through which electric charges to or from the capacitor pass, and wherein when the first switch is turned on and then electric charges to be charged into the control electrode and electric charges to be charged into the capacitor pass through different resistors, each of a resistor through which electric charges from the control electrode pass and a resistor through which electric charges from the capacitor pass is the second resistor;

when the second switch is turned on and then electric charges are discharged from the control electrode and the capacitor, when the second switch is turned on and then electric charges to be discharged from the control electrode and electric charges to be discharged from the capacitor pass through the different resistors, each of a resistor through which electric charges to the control electrode pass and a resistor through which electric charges to the capacitor pass is the first resistor, when the first switch is turned on and then the control electrode and the capacitor are charged with electric charges.

2. The power semiconductor device driving circuit according to claim 1, further including a second diode connected with the other end of the capacitor, wherein the anode of the first diode is connected with the control electrode; the cathode of the second diode is connected with the cathode of the first diode; one end of a third resistor is connected with the connection point between the anode of the second diode and the other end of the capacitor; the other end of the third resistor is connected with the connection point between the first resistor and the first switch.

3. The power semiconductor device driving circuit according to claim 1, further including a second diode connected with the other end of the capacitor, wherein the cathode of the first diode is connected with the control electrode; the anode of the second diode is connected with the anode of the first diode; one end of a third resistor is connected with the connection point between the cathode of the second diode and the other end of the capacitor; the other end of the third resistor is connected with the connection point between the second resistor and the second switch.

4. The power semiconductor device driving circuit according to claim 1, wherein the first diode is a series unit consisting of a first first diode connected with the first resistor and a second first diode connected with the second resistor; the control electrode is connected with the connection point between the first first diode and the second first diode;

one end of a series unit consisting of a first capacitor and a fifth changeover switch is connected with the first main electrode;

one end of a series unit consisting of a second capacitor and a sixth changeover switch is connected with the second main electrode;

the other end of the series unit consisting of the first capacitor and the fifth changeover switch and the other end of the series unit consisting of the second capacitor and the sixth changeover switch are connected with each other at a point, which is a capacitor-changeover connection point;

a series unit consisting of a first changeover switch and a first third resistor is connected between the capacitor-changeover connection point and the other end of the first switch;

a series unit consisting of a second changeover switch and a first second diode is connected between the capacitor-changeover connection point and the connection point between the first resistor and the first first diode in such a way that the direction in which the capacitor-changeover connection point is charged through the first second diode is the forward direction of the first second diode;

a series unit consisting of a third changeover switch and a second second diode is connected between the capacitor-changeover connection point and the connection point between the second resistor and the second first diode in such a way that the direction in which the capacitor-changeover connection point is discharged through the second second diode is the forward direction of the second second diode;

a series unit consisting of a fourth changeover switch and a second third resistor is connected between the connection point between the second resistor and the other end of the second switch and the capacitor-changeover connection point;

any one of the first changeover switch and the second changeover switch is on;

as far as the third changeover switch and the fourth changeover switch are concerned, the third changeover switch turns on when the first changeover switch is on, and the fourth changeover switch turns on when the second changeover switch is on;

any one of the fifth changeover switch and the sixth changeover switch is on.

5. The power semiconductor device driving circuit according to claim 4, further including a changeover switch controller that controls respective on/off states of the first changeover switch, the second changeover switch, the third changeover switch, the fourth changeover switch, the fifth changeover switch, and the sixth changeover switch.

6. The power semiconductor device driving circuit according to claim 1, wherein the power semiconductor device is formed of a wide bandgap semiconductor whose bandgap is larger than bandgap of silicon.

7. The power semiconductor device driving circuit according to claim 6, wherein the material of the wide bandgap semiconductor is any one of a silicon carbide, a gallium nitride-based material, and a diamond.

* * * * *